(12) United States Patent
Fulcomer

(10) Patent No.: US 7,504,970 B2
(45) Date of Patent: Mar. 17, 2009

(54) DATA ENCODER

(75) Inventor: James L. Fulcomer, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/505,749

(22) Filed: Aug. 17, 2006

(65) Prior Publication Data

US 2008/0055121 A1 Mar. 6, 2008

(51) Int. Cl.
*H03M 7/34* (2006.01)
(52) U.S. Cl. ............................ 341/51; 341/50; 341/60; 341/61; 341/63
(58) Field of Classification Search .................. 341/50, 341/51, 60, 61, 63, 65, 67
See application file for complete search history.

(56) References Cited

U.S. PATENT DOCUMENTS

| 4,506,252 | A * | 3/1985 | Jacoby et al. ................... 341/57 |
| 5,550,540 | A * | 8/1996 | Furlan et al. ................... 341/51 |
| 5,663,725 | A * | 9/1997 | Jang .............................. 341/67 |
| 6,272,178 | B1 * | 8/2001 | Nieweglowski et al. 375/240.03 |
| 6,567,127 | B1 * | 5/2003 | Orr et al. ...................... 348/478 |
| 6,580,833 | B2 * | 6/2003 | Goertzen ...................... 382/244 |
| 6,614,369 | B1 * | 9/2003 | Widmer ......................... 341/59 |
| 6,781,435 | B1 * | 8/2004 | Gupta et al. .................. 327/407 |
| 6,885,319 | B2 * | 4/2005 | Geiger et al. .................. 341/51 |
| 7,262,722 | B1 * | 8/2007 | Jahanghir et al. ............. 341/107 |
| 2002/0014980 | A1 * | 2/2002 | Rub et al. ...................... 341/59 |
| 2003/0219078 | A1 * | 11/2003 | Coffey et al. ................. 375/262 |
| 2004/0150458 | A1 * | 8/2004 | Gupta et al. .................. 327/407 |
| 2004/0208243 | A1 * | 10/2004 | Feher ........................... 375/232 |
| 2006/0197689 | A1 * | 9/2006 | Lin et al. ........................ 341/51 |

OTHER PUBLICATIONS

D. Salomon: "Data Compression; The Complete Reference", 2004, Springer, XP002493991, p. 727-p.728.

* cited by examiner

*Primary Examiner*—Linh V Nguyen
(74) *Attorney, Agent, or Firm*—Leonard A. Alkov

(57) ABSTRACT

A data encoder. The novel encoder includes a first circuit for generating a fundamental sequence coded data stream from an incoming input data stream, a second circuit for generating a k-split data stream from the incoming data stream, and a third circuit for combining the fundamental sequence coded data stream and k-split data stream to form a final encoded output. The first circuit includes a circuit for converting the incoming input data stream into a novel intermediate format comprising a set bit word and a zero word count, and a zero-word expander for converting the intermediate format to the fundamental sequence coded data stream. The first circuit may also include a register adapted to store the intermediate format to provide rate buffering.

48 Claims, 2 Drawing Sheets

DATA ENCODER

BACKGROUND OF THE INVENTION

1. Field of the Invention

The present invention relates to signal processing systems. More specifically, the present invention relates to data compression encoders.

2. Description of the Related Art

Data compression is used in a variety of applications to encode data using fewer bits than the original representation in order to reduce the consumption of resources such as storage space or transmission bandwidth. Lossless data compression accomplishes this without any loss of information; that is, the original data can be reconstructed exactly from the encoded data.

Lossless data compression algorithms typically include two sections: a preprocessor, which transforms the input data using a statistical model into samples that can be more efficiently compressed (so that certain symbols occur more frequently than others), and an encoder, which encodes the transformed data using a scheme such that more probable symbols produce shorter output than improbable symbols. Entropy encoders encode symbols such that the code length is proportional to the probability of the symbol. More common symbols therefore use the shortest codes.

Several entropy encoding algorithms are known in the art. The Consultive Committee for Space Data Systems (CCSDS) has recommended the Rice algorithm. A Rice encoder divides an input word into two variable-length sections. One section is encoded using fundamental sequence encoding, and the other section is left alone (remains binary).

A Rice encoder is usually implemented in software running on a computer system. This implies high power consumption, weight, size, and recurring cost. Certain applications, particularly space or airborne applications, have size, weight, and power constraints that would prohibit the use of a large computer system. In addition, some applications require that the encoded data is output at a rate matching that of the incoming data. These applications require an encoder that can operate at faster processing speeds than can be achieved with conventional software implementations. A hardware approach could potentially offer faster processing speeds as well as smaller size, weight, and power consumption; however, conventional encoder architectures are either too large to realize in current digital technologies, or are too slow (i.e., output rates are slower than input rates).

Hence, a need exists in the art for an improved encoder offering smaller size, weight, and power consumption, as well as faster processing speeds than conventional implementations.

SUMMARY OF THE INVENTION

The need in the art is addressed by the data encoder of the present invention. The novel encoder includes a first circuit for generating a fundamental sequence coded data stream from an incoming input data stream, a second circuit for generating a k-split data stream from the incoming data stream, and a third circuit for combining the fundamental sequence coded data stream and k-split data stream to form a final encoded output. The first circuit includes a circuit for converting the incoming input data stream into a novel intermediate format comprising a set bit word and a zero word count, and a zero-word expander for converting the intermediate format to the fundamental sequence coded data stream.

The encoder may also include a register adapted to store the intermediate format to provide rate buffering to allow for full speed input and output rates.

DESCRIPTION OF THE INVENTION

Illustrative embodiments and exemplary applications, will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
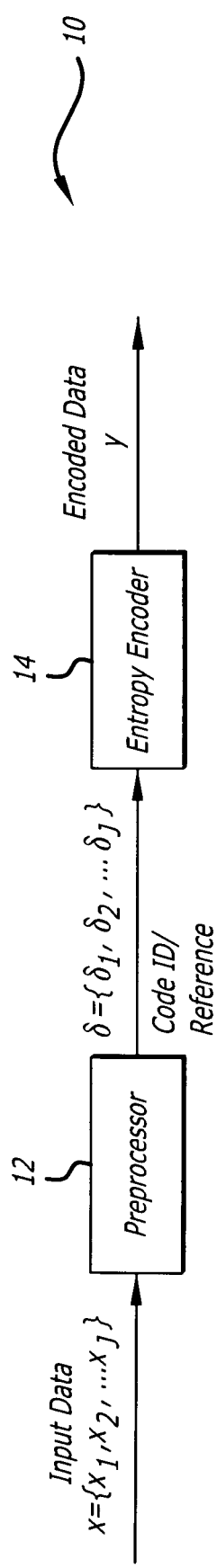
FIG. 1 is a simplified block diagram of a lossless data compression system designed in accordance with an illustrative embodiment of the present invention.

FIG. 1 is a simplified block diagram of a lossless data compression system 10 designed in accordance with an illustrative embodiment of the present invention. The system 10 includes a preprocessor 12 and a novel entropy encoder 14. The preprocessor 12 receives the input data x and transforms it into preprocessed data $\delta$ suitable for the entropy encoding (typically reducing the entropy of the data stream). The entropy encoder 14 then converts the preprocessed data $\delta$ into an encoded bit sequence y.

The input data x is processed in blocks of J n-bit words:

$$x = \{x_1, x_2, \ldots x_J\} \quad [1]$$

where $x_i$ is an n-bit word and n is a constant.

The preprocessor transforms the input data x into blocks of preprocessed samples $\delta$:

$$\delta = \{\delta_1, \delta_2, \ldots, \delta_i, \ldots \delta_J\} \quad [2]$$

where $\delta_i$ is an n-bit integer between 0 and $2^n - 1$. Typically, the preprocessor function transforms the input data x such that the preprocessed samples $\delta$ are statistically independent and identically distributed, and the probability that any sample $\delta_i$ is a value m is a nonincreasing function of m for m=0, 1, ... $2^n-1$. Ideally, the preprocessed data stream is weighted heavily towards zero. One simple method for achieving this weighting is to make a prediction of the next value in the data stream based on the current value, and then transmit the difference between predicted and actual. For example, if the original data stream x is {100, 99, 98, 99}, the preprocessed data stream $\delta$ would be {100, -1, -1, +1}. Note that while the first value of this stream is a large number, the subsequent values are much smaller.

The preprocessor may also output a code ID and/or reference data that can be used in a decoding stage to reverse the preprocessor transform function and recover the original input data.

In an illustrative embodiment, the system 10 uses a Rice encoding algorithm. The Rice algorithm splits each preprocessed sample $\delta_i$ into two sections. The k least significant bits are split off from each sample and the remaining bits (the n–k most significant bits) are encoded using a fundamental sequence (FS) codeword. The variable k can vary for different blocks of J words (all samples within a block are encoded using the same k split). The preprocessor selects a value for k that optimizes compression for that block, and outputs a code ID field that indicates the value of k.

Fundamental sequence encoding uses variable-length codewords, where an integer value m is represented by m zeros followed by a one. The following table shows the FS codeword for various values of the preprocessed sample $\delta_i$.

| $\delta_i$ | FS Codeword |
|---|---|
| 0 | 1 |
| 1 | 01 |
| 2 | 001 |
| . | . |
| . | . |
| . | . |
| $2^n - 1$ | 0000 . . . 00001 ($2^n - 1$ zeros) |

Compression is therefore achieved when smaller values of $\delta_i$ occur more frequently than larger values.

Figure 2:
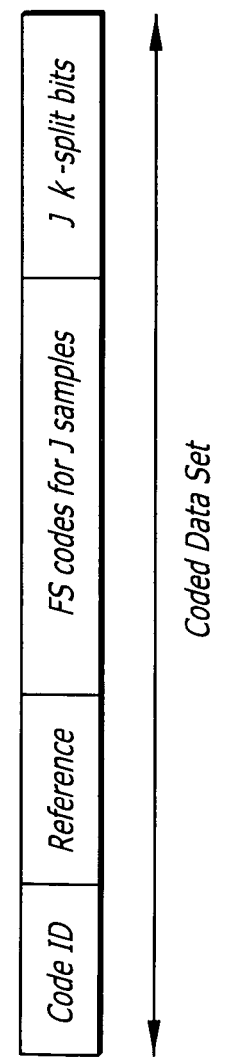
FIG. 2 is a diagram showing an illustrative coded data set format.

The FS codewords from each of the J preprocessed words are concatenated to form a single sequence, which is output along with the removed k-split bits. The final encoded output y includes a coded data set (CDS) for each block of J input words. FIG. 2 is a diagram showing an illustrative coded data set format. Each CDS includes a code ID field that indicates the value of k, an optional reference field that includes information from the preprocessor used to reverse the preprocessor transformation, an FS field that includes the concatenated FS codewords from all J words, and a k-split field including all of the k-split least significant bits removed from the J words.

As discussed above, the entropy encoder is usually implemented in software. Certain applications would benefit from a hardware solution that can offer smaller size, weight and power consumption, as well as faster processing speeds.

The present invention provides a novel entropy encoder architecture suitable for hardware implementations. The novel algorithm disassembles the uncoded input data stream into two separate streams (a fundamental sequence stream and a k-split stream) that are each partially pre-coded and partially assembled, then later processed and recombined into the final output.

Figure 3:
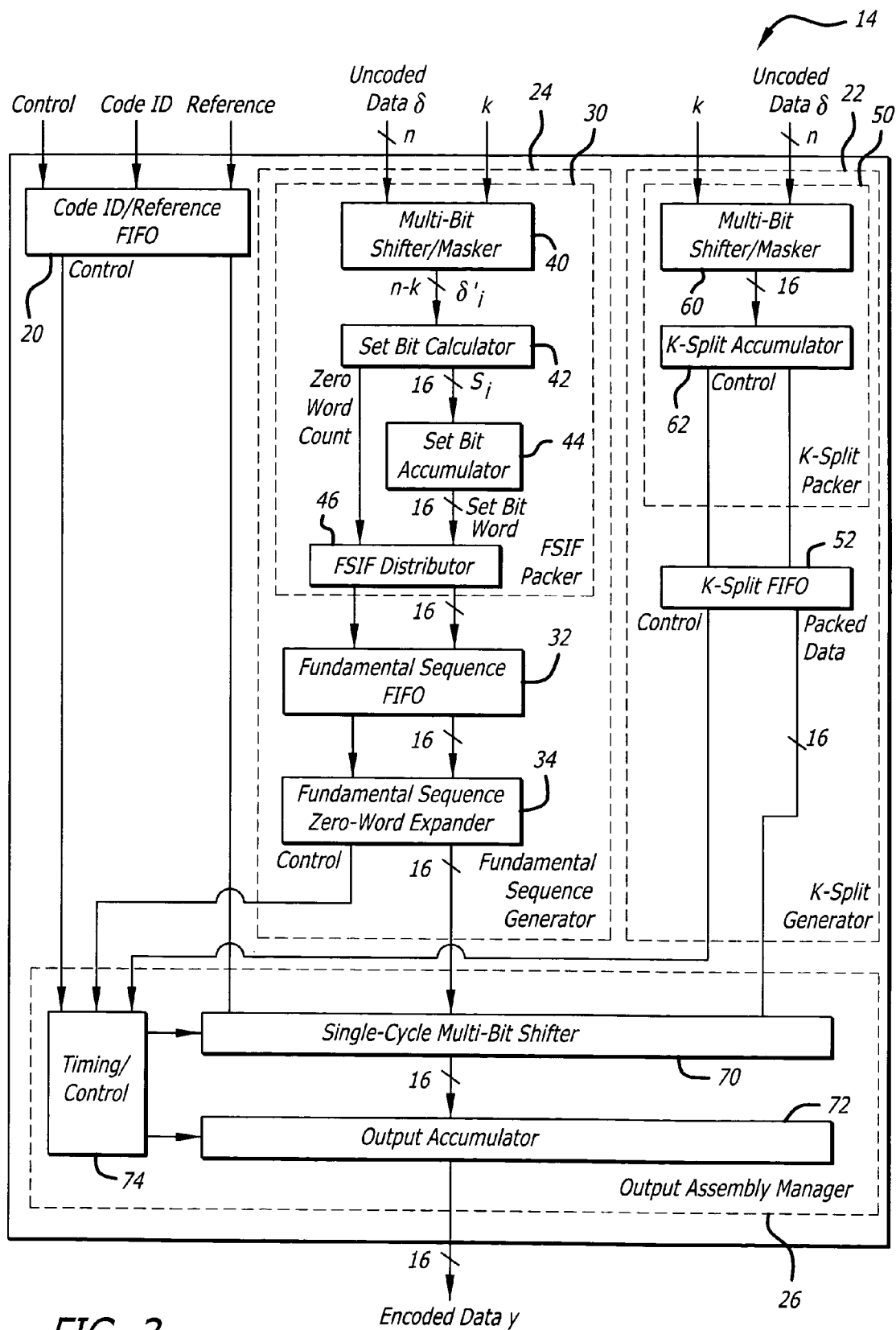
FIG. 3 is a simplified block diagram of an illustrative embodiment of an entropy encoder designed in accordance with the present teachings.

FIG. 3 is a simplified block diagram of an illustrative embodiment of an entropy encoder 14 designed in accordance with the present teachings. The novel encoder 14 includes a code ID/reference FIFO (first in, first out register) 20 for storing the code ID and optional reference fields, a k-split generator 22 for computing, buffering and assembling the k-split output stream, a fundamental sequence generator 24 for computing and assembling the FS output stream, and an output assembly manager 26 for assembling the code ID and reference fields, the FS output stream, and the k-split output stream into a final coded data set. The FS generator 24 and k-split generator 22 operate in parallel to maintain full-speed input and output.

The k-split generator 22 includes a k-split packer 50 and a k-split FIFO 52. The k-split packer 50 accepts the incoming stream of uncoded data $\delta$ and packs the k split bits of each data word $\delta_i$ together into a sequence of M-bit words. The k-split packer 22 includes a multi-bit shifter/masker 60 and a k-split accumulator 62. The multi-bit shifter/masker 60 is a single cycle or pipelinable shifter capable of different shift values every clock cycle. The shifter/masker 60 receives each n-bit uncoded input data word $\delta_i$ and the value of k, and masks out the n–k most significant bits, keeping only the k least significant bits. The k-split bits are shifted and accumulated in the k-split accumulator 62 to form an M-bit word comprising the k-split bits from one or more data words packed together end-to-end. When the accumulator 62 is full, the M-bit word is sent to the k-split FIFO 52, and the next k-split bits are accumulated in the next M-bit word. Thus, when the M-bit words are strung together end-to-end, they form the final k-split data field. The FIFO 52 is large enough to store the pre-packed k-split data for at least one full CDS, thus allowing the final packing and output stage to stream data out at full speed. In an illustrative embodiment, M is 16 bits; however, other word lengths can be used without departing from the scope of the present teachings.

The FS generator 24 uses a novel FS encoding technique that includes transforming the incoming stream of uncoded data into an intermediate format. The novel fundamental sequence intermediate format (FSIF) includes two fields: a pre-packed set bit word and a zero word count. The set bit word is an L-bit word with one or more bits set to '1', each set bit representing a full or partial uncoded data word. The zero word count, represents the number of all-zero words to be inserted between the pre-packed set bit words. This transformation prepares the incoming data for easy conversion to full fundamental sequence coding while allowing the input stream to be accepted at full speed. The intermediate format data can be stored in a shallow FIFO to absorb any short term bursts of inefficient compression. The intermediate format data is then converted to full FS code and output at full speed.

In the illustrative embodiment, the FS generator 24 includes a FSIF packer 30, a fundamental sequence FIFO 32, and a zero-word expander 34. The FSIF packer 30 accepts the incoming stream of uncoded data $\delta$ and transforms it into the intermediate format comprised of a pre-packed set bit word and a zero word count. This intermediate format is stored in the FIFO 32. The zero-word expander 34 pulls the intermediate format data from the FIFO 32 and converts it to a fundamental sequence coded output by expanding the zero word count into L-bit all-zero words and merging them with the pre-packed set bit words.

In the illustrative embodiment, the FSIF packer 30 includes a multi-bit shifter/masker 40, a set bit calculator 42, a set bit accumulator 44, and an FSIF distributor 46. The multi-bit shifter/masker 40 receives each uncoded input data word $\delta_i$ and the value of k, and masks out the k least significant bits. The remaining n–k bit word $\delta'_i$ is sent to the set bit calculator 42.

The set bit calculator 42 includes an adder adapted to add the truncated data words $\delta'_i$ together in a particular way and output the resulting sums using a special "one-hot" format, and logic for generating a zero word count. A one-hot format word has one and only one bit set to '1'; all other bits are set to zero. The position of the '1' defines the value of the word. For example, consider an L-bit word $b=\{b_{L-1}, \ldots, b_j, \ldots, b_2, b_1, b_0\}$. A value of j encoded in one-hot would be all zeros except for a '1' in the $b_j$ position. Thus, a value of '2' would be encoded as $\{000 \ldots 000100\}$.

The first sum $s_1$ output by the set bit calculator 42 is formed by adding the first truncated word $\delta'_i$ to zero. The result is output by the set bit calculator 42 in one-hot format. All subsequent sums $s_i$ are formed by adding the incoming word $\delta'_i$ to the previous sum $s_{i-1}$ plus one. Thus:

$$s_1 = \delta'_1 \quad [3]$$

$$s_2 = s_1 + \delta'_2 + 1$$

$$\vdots$$

$$s_i = s_{i-1} + \delta'_i + 1$$

Each sum $s_i$ is output in one-hot format to the set bit accumulator 44. The set bit calculator 42 is also adapted to output a zero word count in addition to an L-bit one-hot encoded word. In an illustrative embodiment, L is set to 16 bits (other word lengths can be used without departing from the scope of the present teachings). When the calculator 42 tries to encode a number greater than L−1 in one-hot format, the adder overflows. The calculator therefore includes logic for determining when the adder overflows and by how much, i.e., by how many sets of L zeros. This zero word count is output to the FSIF distributor 46.

The set bit accumulator 44 accumulates the sums output from the set bit calculator 42 to form a pre-packed set bit word with one or more bits set to '1', each set bit representing a full or partial uncoded data word. The accumulator 44 starts with an L-bit word of all zeros. Each word output by the set bit calculator 42 includes one and only one bit set to '1'. Each time the accumulator 44 receives a word from the calculator 42, the accumulator 44 sets one of its bits (in the same position as the '1' bit in the word output from the calculator 42) to '1'. This process is repeated for each word the accumulator 44 receives, until the calculator 42 overflows. The accumulator 44 thus keeps track of all the '1' bits from one or more words. When the zero word count indicates that the set bit calculator 42 has overflowed, the L-bit word in the accumulator 44 is output to the FSIF distributor 46. The accumulator 44 then resets to zero and begins to accumulate the next L-bit word.

The FSIF distributor 46 is a timing and control function used to parse the set bit accumulator and set bit calculator outputs into the intermediate format. The distributor 46 is adapted to receive the zero word count from the set bit calculator 42. When the zero word count indicates that the set bit calculator 42 has overflowed, the distributor 46 pulls the L-bit word from the accumulator 44 and outputs the L-bit word and the zero word count to the FIFO 32.

The following is a short numerical example illustrating the operation of the FSIF packer 30. Consider an input sequence $\delta'$ of $\{2, 1, 3, 32, 2\}$ and L=16 bits. On the first clock cycle, the set bit calculator 42 receives a '2' and therefore outputs a 2 encoded in one-hot format to the accumulator 44:

$$s_1 = \delta'_1 = 2 = \{0000000000000100\} \quad [4]$$

The accumulator 44 receives the sum $s_1$ and accumulates it with its previous state (all zeros), resulting in $\{0000000000000100\}$.

On the second cycle, the set bit calculator 42 receives a '1' and outputs the following sum encoded in one-hot format to the accumulator 44:

$$s_2 = s_1 + \delta'_2 + 1 = 2 + 1 + 1 = 4 = \{0000000000010000\} \quad [5]$$

The accumulator 44 accumulates the new sum $s_2$ with its previous state, resulting in $\{0000000000010100\}$.

On the third cycle, the set bit calculator 42 receives a '3' and outputs the following sum to the accumulator 44:

$$s_3 = s_2 + \delta'_3 + 1 = 4 + 3 + 1 = 8 = \{0000000100000000\} \quad [6]$$

The accumulator 44 accumulates the new sum $s_3$ with its previous state, resulting in $\{0000000100010100\}$. This accumulator output is the FS code for (reading from right to left) the sequence $\{2, 1, 3\}$. The accumulator 44 is thus forming portions of the concatenated fundamental sequence coded output.

On the fourth cycle, the set bit calculator 42 receives a '32'. When it tries to add it to its previous sum, the adder overflows:

$$s_4 = s_3 + \delta'_4 + 1 = 8 + 32 + 1 = 41 = \{1 \text{ followed by 41 zeros}\} \quad [7]$$

The set bit calculator logic therefore outputs a zero word count of '2' (representing two sets of 16 zeros, or 32 zeros) to the distributor 46 and the 16-bit remainder $\{0000000100000000\}$ to the accumulator 44. When the distributor 46 receives the zero word count indicating that the set bit calculator 42 has overflowed, it pulls the 16-bit word that was in the accumulator 44 (before the overflow). In this example, it pulls the word $\{0000000100010100\}$ from the accumulator 44 and outputs the word and the zero word count to the FIFO 32. The zero word count of '2' indicates that the zero-word expander 34 should output the 16-bit word from the accumulator, followed by one 16-bit word of all zeros. (A zero word count of '3' would direct it to output the 16-bit word form the accumulator, followed by two 16-bit words of all zeros.) The accumulator 44 is then reset to zero and accumulates the new 16-bit remainder $\{0000000100000000\}$ from the set bit calculator 42.

On the fifth cycle, the set bit calculator 42 receives a '2' and outputs the following sum to the accumulator 44:

$$s_5 = s_4 + \delta'_5 + 1 = 8 + 2 + 1 = 11 = \{0000100000000000\} \quad [8]$$

where the previous sum $s_4$ is set to the value of the overflow remainder ($s_4 = 8$).

The accumulator 44 accumulates the new sum $s_5$ with its previous state, resulting in $\{0000100100000000\}$. This process continues until all J words in the incoming data block $\delta$ are processed.

Returning to the FS generator 30, the intermediate format data output from the distributor 46 is stored in the FIFO 32. The zero-word expander 34 pulls the intermediate format data (the pre-packed set bit word and the zero word count) from the FIFO 32 and converts it to a full, fundamental sequence coded output. The zero-word expander 34 includes a first circuit adapted to convert the zero word count to a number of L-bit words of all zeros and a second circuit adapted to output the set bit word followed by the all-zero words (if any). A zero word count of '1' corresponds with no all-zero words, so the zero-word expander 34 just outputs the pre-packed set bit word and waits to receive the next set bit word and zero word count. A zero word count of '2' corresponds with one all-zero word, so the zero-word expander 34 outputs the pre-packed set bit word followed by one L-bit word of all zeros. The sequence of words output from the zero-word expander 34 forms the concatenated FS coded output.

The FIFO 32 provides internal rate buffering to allow full-speed input and output rates. When the FSIF packer 30 processes an input word $\delta'_i$ having a large value (i.e., resulting in a zero word count greater than 1), the output from the zero-word expander 34 will take more than one clock cycle: one cycle for outputting the pre-packed set bit word and an additional clock cycle for each all-zero word. On the other hand, when the FSIF packer 30 processes input words $\delta'_i$ having small values (i.e., much smaller than L−1), several input words are accumulated into a single L-bit output. Thus, several clock cycles of input result in only one clock cycle of output. The system preprocessor is designed to transform the original input data x into samples $\delta$ such that small values of $\delta'_i$ occur much more frequently than large values. The FIFO 32 is adapted to provide rate buffering when a large value is processed by temporarily storing the intermediate format data while the zero-word expander generates its all-zero outputs, allowing the output to catch up with the input. The output rate can therefore keep up indefinitely with the input rate without requiring a faster internal processing clock.

Thus, the novel encoding method of the present invention splits the processing of incoming data streams into a pre-rate buffer process and a post-rate buffer process. The separation of the processing job into these particular functions enables the use of internal rate buffering to provide full-speed input and output. The pre-rate buffer process includes the conversion of the incoming data stream into the intermediate format by the FSIF packer 30. This process keeps up with the input rate. The post-rate buffer process includes the conversion of the intermediate format data into the fundamental sequence coded output by the zero-word expander 34. This process may fall behind when a large value is input. The FIFO 32 absorbs any short-term delays in the zero-word expander 34.

The encoder 14 also includes an output assembly manager 26 that assembles the code ID and reference fields from the code ID/reference FIFO 20, the FS coded data stream from the FS generator 24, and the k-split data stream from the k-split generator 22 into a final coded data set. In the illustrative embodiment, the output assembly manager 26 includes a multi-bit shifter 70, an output accumulator 72, and a timing and control unit 74.

The timing and control unit 74 is adapted to receive control signals from the code ID/reference FIFO 20, zero-word expander 34, and k-split FIFO 52 and in accordance therewith, generate control signals for the shifter 70 and accumulator 72.

In the illustrative embodiment, the encoder output y is a stream of L-bit words, where L=16 bits. The shifter 70 is a 32-bit (2L bits) register adapted to pull words from the code ID/reference FIFO 20, zero-word expander 34, or k-split FIFO 52 in accordance with the control signal from the timing and control unit 74. The shifter 70 first loads the code ID and any reference data from the code ID/reference FIFO 20. The first 16-bit word output from the zero-word expander 34 is loaded immediately following the code ID and reference data. Thus, if the code ID and reference data take up a total of 5 bits, they are stored in bit positions 0 through 4, and the first FS word is loaded into bit positions 5 through 20. The first 16 bits are pulled by the accumulator 72 and output from the encoder 14. The remaining bits are shifted over (to start at bit position 0) and the next FS word is loaded. The first 16 bits are pulled by the accumulator 72 and the remaining bits are shifted over. This process continues until all of the FS words generated by one data block are loaded into the shifter 70. The first word from the k-split FIFO 52 is then loaded behind the last FS word. Again, the first 16 bits are pulled by the accumulator 72 and the remaining bits are shifted over. The next k-split word is then loaded into the shifter 70. This process continues until all of the k-split words generated by one data block are loaded into the shifter 70 and output by the accumulator 72. The data stream of words output by the accumulator 72 form the final coded data set y.

The encoder architecture of the present invention is easily implementable in multiple digital integrated circuit technologies (ASIC, FPGA, etc.). With a hardware implementation, the encoder can process data at high rates while consuming a minimum amount of power, weight, and circuit board area (low gate count). The novel split-stream technique (disassembling the input stream into a fundamental sequence stream and a k-split stream, and processing the two in parallel) and the novel split-processing technique (dividing the fundamental sequence encoding into a pre-rate buffer process and a post-rate buffer process by introducing a fundamental sequence intermediate format) allow for full speed compression where the output rate indefinitely keeps up with the input rate, i.e., encoding can run as fast as the fastest internal processing clock.

Thus, the present invention has been described herein with reference to a particular embodiment for a particular application. Those having-ordinary skill in the art and access to the present teachings will recognize additional modifications, applications and embodiments within the scope thereof. For example, while the invention has been described with reference to a Rice encoder, the novel techniques described can be used with other encoding algorithms without departing from the scope of the present teachings. The encoder can also be configurable for different data widths, coded data set sizes, code selection schemes, etc.

It is therefore intended by the appended claims to cover any and all such applications, modifications and embodiments within the scope of the present invention.

Accordingly,

What is claimed is:

1. An encoder comprising:
   first means for generating a fundamental sequence coded data stream from an incoming input data stream comprising a sequence of n-bit input data words, wherein said fundamental sequence coded data stream includes n bits minus k bits of each input data word encoded using fundamental sequence code, where n and k are integers;
   second means for generating a k-split data stream from said incoming data stream, wherein said k-split data stream includes k bits of each input data word; and
   third means for combining said fundamental sequence coded data stream and k-split data stream to form a final encoded output.

2. The invention of claim 1 wherein said second means operates in parallel with said first means.

3. The invention of claim 1 wherein said first means includes fourth means for converting said incoming input data stream into an intermediate format comprising a set bit word and a zero word count.

4. The invention of claim 3 wherein said first means further includes fifth means for converting said intermediate format to a fundamental sequence coded data stream.

5. The invention of claim 4 wherein said first means further includes means for storing said intermediate format to provide rate buffering.

6. The invention of claim 5 wherein said fourth means includes means for receiving said incoming input data stream and an integer value k, and masking out k bits from each word of said input stream to output a stream of truncated input data words.

7. The invention of claim 6 wherein said fourth means further includes means for adding said truncated input data words and outputting a resulting sum.

8. The invention of claim 7 wherein said sum is output as an L-bit word encoded in one-hot format.

9. The invention of claim 8 wherein said fourth means further includes means for generating a zero word count indicating when a sum is larger than can be encoded as an L-bit word and by how many sets of L-bit all-zero words.

10. The invention of claim 9 wherein a first sum is equal to a first truncated input word.

11. The invention of claim 10 wherein subsequent sums are equal to a previous sum plus an incoming truncated input word plus one.

12. The invention of claim 9 wherein said fourth means further includes means for accumulating said sums to form a set bit word.

13. The invention of claim 4 wherein said fifth means includes means for receiving said zero word count and set bit word and outputting said set-bit word and a number of L-bit all-zero words, wherein said number of all-zero words is determined by said zero word count.

14. The invention of claim 1 wherein said second means includes means for receiving said incoming input data stream and an integer value k, and removing and outputting k bits from each word of said input stream.

15. The invention of claim 14 wherein said second means further includes means for accumulating said k bits from each word to form a k-split data stream of M-bit words.

16. The invention of claim 15 wherein said second means further includes means for storing said M-bit words.

17. An encoder comprising:
a fundamental sequence generator adapted to receive an incoming input data stream comprising a sequence of n-bit input data words and output a fundamental sequence coded data stream, wherein said fundamental sequence coded data stream includes n bits minus k bits of each input data word encoded using fundamental sequence code, where n and k are integers;
a k-split generator operating in parallel with said fundamental sequence generator adapted to receive said incoming data stream and output a k-split data stream, wherein said k-split data stream includes k bits of each input data word; and
an output assembly manager adapted to combine said fundamental sequence coded data stream and k-split data stream to form a final encoded output.

18. An encoder comprising:
a fundamental sequence intermediate format packer adapted to convert an incoming input data stream into an intermediate format comprising a set bit word and a zero word count;
a zero-word expander adapted to convert said intermediate format to a fundamental sequence coded data stream;
a k-split packer operating in parallel with said fundamental sequence intermediate format packer adapted to receive said incoming data stream and output a k-split data stream; and
an output assembly manager adapted to combine said fundamental sequence coded data stream and k-split data stream to form a final encoded output.

19. The invention of claim 18 wherein said fundamental sequence intermediate format packer includes a multi-bit shifter/masker adapted to receive said incoming input data stream and an integer value k, and masking out k bits from each word of said input stream to output a stream of truncated input data words.

20. The invention of claim 19 wherein said fundamental sequence intermediate format packer further includes a set bit calculator adapted to add said truncated input data words and output a resulting sum.

21. The invention of claim 20 wherein said set bit calculator is adapted to output said sum as an L-bit word encoded in one-hot format.

22. The invention of claim 21 wherein said set bit calculator is further adapted to generate a zero word count indicating when a sum is larger than can be encoded as an L-bit word and by how many sets of L-bit all-zero words.

23. The invention of claim 22 wherein a first sum is equal to a first truncated input word.

24. The invention of claim 23 wherein subsequent sums are equal to a previous sum plus an incoming truncated input word plus one.

25. The invention of claim 24 wherein said fundamental sequence intermediate format packer further includes an accumulator adapted to accumulate said sums to form a set bit word.

26. The invention of claim 25 wherein said fundamental sequence intermediate format packer further includes a distributor adapted to receive said zero word count and in accordance therewith, pull said set bit word from said accumulator and reset said accumulator to zero.

27. The invention of claim 26 wherein said encoder further includes a first register adapted to store said zero word count and set bit word to provide rate buffering.

28. The invention of claim 27 wherein said zero-word expander is adapted to receive said zero word count and set bit word from said first register and output said set bit word and a number of L-bit all-zero words, wherein said number of all-zero words is determined by said zero word count.

29. The invention of claim 18 wherein said k-split packer includes a multi-bit shifter/masker adapted to receive said incoming input data stream and an integer value k, and remove and output k bits from each word of said input stream.

30. The invention of claim 29 wherein said k-split packer further includes an accumulator adapted to accumulate said k bits from each word to form a k-split data stream of M-bit words.

31. The invention of claim 30 wherein said encoder further includes a second register adapted to store said M-bit words.

32. The invention of claim 31 wherein said second register is large enough to store k-split data for at least one full coded data set.

33. The invention of claim 32 wherein said encoder further includes a third register adapted to store a code ID and/or reference data.

34. The invention of claim 18 wherein said output assembly manager includes a timing and control unit adapted to generate one or more control signals.

35. The invention of claim 34 wherein said output assembly manager further includes a multi-bit shifter adapted to receive and combine said code ID and/or reference data, fundamental sequence coded data stream, and k-split data stream in accordance with said control signals to form portions of said final encoded output.

36. The invention of claim 35 wherein said output assembly manager further includes an output accumulator adapted to pull L-bit words from said multi-bit shifter and output them from the encoder.

37. An encoder comprising:
a first circuit for converting an incoming data stream comprising a sequence of input data words into an intermediate format comprising a pre-packed set bit word and a zero word count, wherein said set bit word is a partially fundamental sequence coded word comprising one or more set bits, each set bit representing a full or partial input data word, and said zero word count represents a number of all-zero words to be inserted between set bit words, and
a second circuit for converting said intermediate format into a fundamental sequence coded output.

38. The invention of claim 37 wherein said first circuit includes a multi-bit shifter/masker adapted to receive said incoming input data stream and an integer value k, and masking out k bits from each word of said input stream to output a stream of truncated input data words.

39. The invention of claim 38 wherein said first circuit further includes a set bit calculator adapted to add said truncated input data words and output a resulting sum.

40. The invention of claim 39 wherein said set bit calculator is adapted to output said sum as an L-bit word encoded in one-hot format.

41. The invention of claim 40 wherein said set bit calculator is further adapted to generate a zero word count indicating when a sum is larger than can be encoded as an L-bit word and by how many sets of L-bit all-zero words.

42. The invention of claim 41 wherein a first sum is equal to a first truncated input word.

43. The invention of claim 42 wherein subsequent sums are equal to a previous sum plus an incoming truncated input word plus one.

44. The invention of claim 43 wherein said first circuit further includes an accumulator adapted to accumulate said sums to form a set bit word.

45. The invention of claim 44 wherein said first circuit further includes a distributor adapted to receive said zero word count and in accordance therewith, pull said set bit word from said accumulator and reset said accumulator to zero.

46. The invention of claim 45 wherein said encoder further includes a first register adapted to store said zero word count and set bit word to provide rate buffering.

47. The invention of claim 46 wherein said second circuit is adapted to receive said zero word count and set bit word from said first register and output said set bit word and a number of L-bit all-zero words, wherein said number of all-zero words is determined by said zero word count.

48. A method for encoding an input data stream comprising a sequence of n-bit input data words including the steps of:
  processing said input data stream to generate a fundamental sequence coded data stream, wherein said fundamental sequence coded data stream includes n bits minus k bits of each input data word encoded using fundamental sequence code, where n and k are integers;
  processing said input data stream to generate a k-split data stream in parallel with said fundamental sequence coded data stream, wherein said k-split data stream includes k bits of each input data word; and
  combining said fundamental sequence coded data stream and k-split data stream to form a final encoded output.

* * * * *